(12) United States Patent
Nagasawa et al.

(10) Patent No.: US 9,693,451 B2
(45) Date of Patent: Jun. 27, 2017

(54) WIRING BOARD, MOUNTING STRUCTURE USING SAME, AND METHOD OF MANUFACTURING WIRING BOARD

(71) Applicant: KYOCERA Corporation, Kyoto-shi, Kyoto (JP)

(72) Inventors: Tadashi Nagasawa, Kyoto (JP); Katsura Hayashi, Kyoto (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 341 days.

(21) Appl. No.: 14/380,207

(22) PCT Filed: Feb. 20, 2013

(86) PCT No.: PCT/JP2013/054120
§ 371 (c)(1),
(2) Date: Aug. 21, 2014

(87) PCT Pub. No.: WO2013/125558
PCT Pub. Date: Aug. 29, 2013

(65) Prior Publication Data
US 2015/0037611 A1    Feb. 5, 2015

(30) Foreign Application Priority Data

Feb. 23, 2012  (JP) .................. 2012-037391

(51) Int. Cl.
*H05B 3/02*    (2006.01)
*H05K 1/03*    (2006.01)
(Continued)

(52) U.S. Cl.
CPC .......... *H05K 1/036* (2013.01); *H05K 3/4602* (2013.01); *H05K 3/467* (2013.01); *H05K 3/4661* (2013.01);
(Continued)

(58) Field of Classification Search
CPC . H01B 3/02; H01L 2224/0401; H01L 23/145; H01L 2924/00014
See application file for complete search history.

(56) References Cited

U.S. PATENT DOCUMENTS

| 5,275,878 A | 1/1994 | Yamakawa et al. |
| 2013/0149514 A1 | 6/2013 | Hayashi |
| 2013/0256018 A1* | 10/2013 | Hayashi ............... H05K 3/4655 174/258 |

FOREIGN PATENT DOCUMENTS

| JP | 4-133386 A | 5/1992 |
| JP | 8-118194 A | 5/1996 |

(Continued)

OTHER PUBLICATIONS

International Search Report, PCT/JP2013/054120, Mar. 11, 2013, 2 pgs.

(Continued)

*Primary Examiner* — Mark Kaucher
(74) *Attorney, Agent, or Firm* — Volpe and Koenig, P.C.

(57) ABSTRACT

A wiring board (3) according to an embodiment of the present invention includes an inorganic insulating layer (11A); a first resin layer (12A) on one main surface of the inorganic insulating layer (11A); a second resin layer (13A) on another main surface of the inorganic insulating layer (11A); and a conductive layer (8) partially on one main surface of the second resin layer (13A), the one main surface being on an opposite side to the inorganic insulating layer (11A). The inorganic insulating layer (11A) includes a plurality of first inorganic insulating particles (14) which are bound to each other at a part of each of the first inorganic insulating particles and gaps (G) surrounded by the plurality of first inorganic insulating particles (14). A part of the first (Continued)

resin layer (12A) and a part of the second resin layer (13A) are located inside the gaps (G).

5 Claims, 7 Drawing Sheets

(51) Int. Cl.
    *H05K 3/46*         (2006.01)
    *H05K 3/34*         (2006.01)

(52) U.S. Cl.
    CPC ......... *H05K 3/4673* (2013.01); *H05K 3/3436* (2013.01); *H05K 2201/0175* (2013.01); *H05K 2201/0195* (2013.01); *H05K 2201/0209* (2013.01); *H05K 2201/0269* (2013.01); *H05K 2201/068* (2013.01)

(56) References Cited

FOREIGN PATENT DOCUMENTS

| | | | | |
|---|---|---|---|---|
| JP | 2007-281115 A | 10/2007 | | |
| JP | 2011-159649 A | 8/2011 | | |
| JP | WO 2012014875 A1 * | 2/2012 | ............. | B32B 27/14 |
| WO | 2012/014875 A1 | 2/2012 | | |

OTHER PUBLICATIONS

Chinese Office Action with English concise explanation, Chinese Patent Application No. 201380010603.3, Aug. 18, 2016, 7 pgs.

* cited by examiner (a)

(b)

(c)

(a)

(b)

(a)

(b)

(a)

(b)

WIRING BOARD, MOUNTING STRUCTURE USING SAME, AND METHOD OF MANUFACTURING WIRING BOARD

TECHNICAL FIELD

The present invention relates to a wiring board to be used for electronic equipment (for example, various audio visual apparatuses, household electric appliances, communication equipment, computer devices, and peripheral equipment thereof), a mounting structure using the same, and a method of manufacturing the wiring board.

BACKGROUND ART

In the related art, as a mounting structure to be used for electronic equipment, a structure in which an electronic component is mounted on a wiring board has been known.

As the wiring board, for example, as disclosed in Japanese Unexamined Patent Application Publication No. 8-118194, a wiring board having an insulating layer made of a resin material is used. In such a wiring board, since a resin material whose thermal expansion coefficient is greater than that of an electronic component is used for the insulating layer, the thermal expansion coefficient of the wiring board tends to be greater than that of the electronic component.

As a result, when a mounting structure is heated at the time of mounting or operating the electronic component, thermal stress is likely to be applied to a joint of the wiring board and the electronic component due to a difference between the thermal expansion coefficient of the wiring board and the thermal expansion coefficient of the electronic component. Therefore, connection reliability between the wiring board and the electronic component is likely to be degraded and electrical reliability of the mounting structure is likely to be degraded.

SUMMARY OF INVENTION

The present invention aims to provide a wiring board which responds to a demand for improving electrical reliability of a mounting structure, the mounting structure using the same, and a method of manufacturing the wiring board.

A wiring board according to an embodiment of the present invention includes an inorganic insulating layer; a first resin layer on one main surface of the inorganic insulating layer; a second resin layer on another main surface of the inorganic insulating layer; and a conductive layer partially on one main surface of the second resin layer, the one main surface being on an opposite side to the inorganic insulating layer. The inorganic insulating layer includes a plurality of first inorganic insulating particles which are bound to each other at a part of each of the first inorganic insulating particles, and gaps which are surrounded by the plurality of first inorganic insulating particles. A part of the first resin layer and a part of the second resin layer are located inside the gaps.

Further, a mounting structure according to an embodiment of the present invention includes the above-described wiring board and an electronic component mounted on one main surface of a side of the second resin layer of the wiring board.

A method of manufacturing a wiring board according to an embodiment of the present invention includes preparing an inorganic insulating layer that includes a plurality of first inorganic insulating particles which are bound to each other at a part of each of the first inorganic insulating particles and gaps which are surrounded by the plurality of first inorganic insulating particles. Further, the above-described method of manufacturing a wiring board includes disposing a first resin precursor formed of an uncured first resin material in a form of a layer on one main surface of the inorganic insulating layer. Further, the above-described method of manufacturing a wiring board includes disposing a second resin precursor formed of an uncured second resin material in a form of a layer on another main surface of the inorganic insulating layer. Further, the above-described method of manufacturing a wiring board includes heating and pressing the inorganic insulating layer on which the first resin precursor is disposed at a temperature of less than a curing starting temperature of the first resin material and allowing a part of the first resin precursor to be located inside a part of the gaps of the inorganic insulating layer. Further, the above-described method of manufacturing a wiring board includes heating the inorganic insulating layer and the first resin precursor at a temperature higher than or equal to the curing starting temperature of the first resin material and making the first resin precursor into a first resin layer. Further, the above-described method of manufacturing a wiring board includes heating and pressing the inorganic insulating layer on which the second resin precursor is disposed at a temperature of less than the curing starting temperature of the second resin material and allowing a part of the second resin precursor to be located inside a part of the gaps of the inorganic insulating layer. Further, the above-described method of manufacturing a wiring board includes heating the inorganic insulating layer and the second resin precursor at a temperature higher than or equal to the curing starting temperature of the second resin material and making the second resin precursor into a second resin layer. Further, the above-described method of manufacturing a wiring board includes forming a conductive layer on one main surface of the second resin layer, the one main surface being on an opposite side to the inorganic insulating layer.

According to the wiring board of the embodiment of the present invention, since an insulating layer includes the inorganic insulating layer disposed between the first resin layer and the second resin layer, the thermal expansion coefficient of the insulating layer can be reduced. Therefore, the connection reliability between the wiring board and the electronic component can be improved and thus the electrical reliability of the mounting structure can be improved.

Further, according to the mounting structure of the embodiment of the present invention, since the above-described wiring board is included, the electrical reliability of the mounting structure can be improved.

According to the method of manufacturing a wiring board of the embodiment of the present invention, since the wiring board having good connection reliability with the electronic component can be prepared, the electrical reliability of the mounting structure can be improved.

DESCRIPTION OF EMBODIMENTS

<Mounting Structure>

Hereinafter, a mounting structure including a wiring board according to an embodiment of the present invention will be described with reference to the accompanying drawings.

Figure 1:
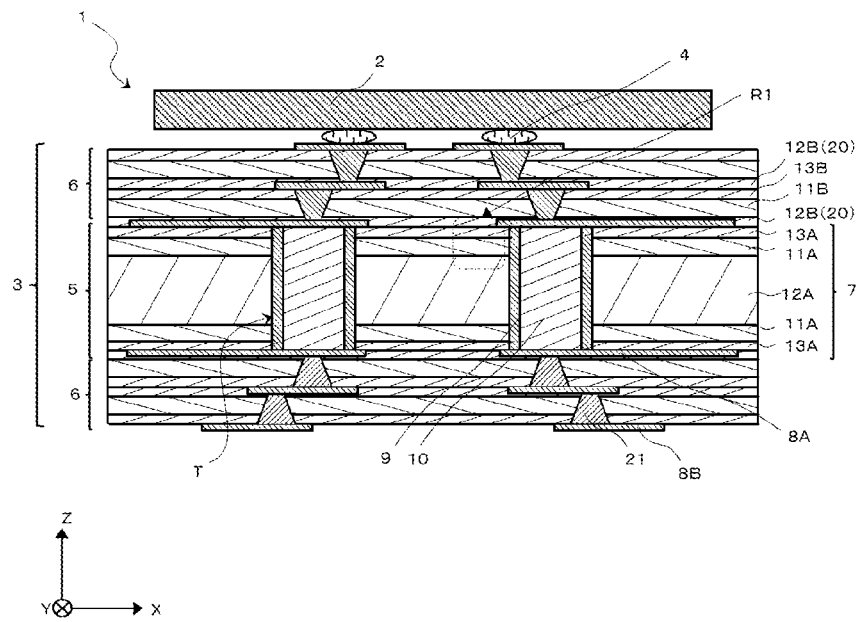
FIG. 1 is a cross-sectional view in which a mounting structure according to an embodiment of the present invention is cut in a thickness direction.

A mounting structure 1 illustrated in FIG. 1 is used for electronic equipment such as various audio visual apparatuses, household electric appliances, communication equipment, computer devices, and peripheral equipment thereof. The mounting structure 1 includes an electronic component 2 and a wiring board 3 in which the electronic component 2 is mounted on one main surface thereof.

The electronic component 2 is flip-chip mounted on the wiring board 3 with a bump 4 including a conductive material such as a solder between them. A semiconductor element such as an IC or an LSI can be used for the electronic component 2. The electronic component 2 is made of a semiconductor material such as silicon, germanium, gallium arsenide, gallium arsenide phosphide, gallium nitride, or silicon carbide.

The thickness of the electronic component 2 is, for example, 0.05 mm or more and 1 mm or less. The thermal expansion coefficient of the electronic component 2 in a plane direction (XY plane direction) is, for example, 3 ppm/° C. or more and 5 ppm/° C. or less. Further, the thickness of the electronic component 2 is measured by observing the cross section of the electronic component 2 using a scanning electron microscope or a transmission electron microscope, measuring the lengths of 10 or more places along the thickness direction (Z direction), and calculating the average value thereof. In addition, the thermal expansion coefficient of the electronic component 2 is measured by a measurement method in conformity with JIS K 7197-1991 using a commercially available TMA apparatus. Hereinafter, the thickness and the thermal expansion coefficient of each member are measured in the same manner as those of the electronic component 2.

The wiring board 3 includes a core board 5 and a pair of wiring layers 6 formed on both main surfaces of the core board 5. The thickness of the wiring board 3 is, for example, 0.05 mm or more and 1.5 mm or less. The Young's modulus of the wiring board 3 is, for example, 5 GPa or more and 30 GPa or less. The thermal expansion coefficient of the wiring board 3 in the plane direction is, for example, 4 ppm/° C. or more and 20 ppm/° C. or less. Further, the Young's modulus of the wiring board 3 can be measured by cutting a rectangular test piece from the wiring board 3 and dividing the tensile stress thereof per a unit cross-sectional area obtained by measuring the test piece using a tensile testing machine by the elongation of a resin. Hereinafter, the Young's modulus of each member can be measured in the same manner as that of the wiring board 3 except the case particularly described.

The core board 5 is a board to increase the Young's modulus of the wiring board 3. The core board 5 includes a base 7, a pair of conductive layers 8A formed on both main surfaces of the base 7, a cylindrical through-hole conductor 9 electrically connecting the pair of conductive layers 8A, and an insulator 10 filling the inside of the cylindrical through-hole conductor 9.

The base 7 is a board to increase the Young's modulus of the core board 5. The base 7 includes a pair of inorganic insulating layers 11A, a first resin layer 12A positioned between the pair of inorganic insulating layers 11A, and a second resin layer 13A positioned on one main surface of the inorganic insulating layer 11A, the one main surface on an opposite side to the first resin layer 12A.

Figure 2:
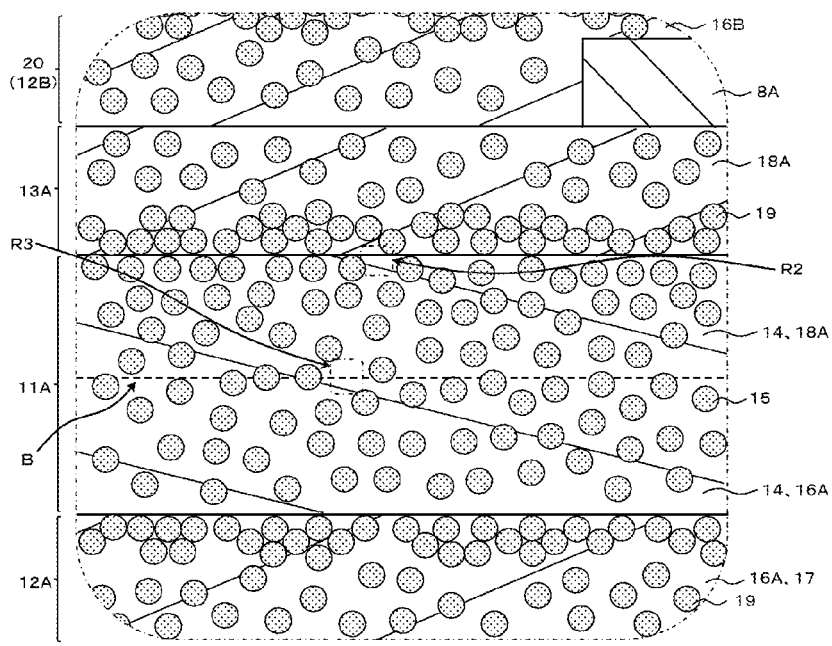
FIG. 2 is a cross-sectional view cut in the thickness direction in which a part R1 in FIG. 1 is enlarged.
Figure 3:
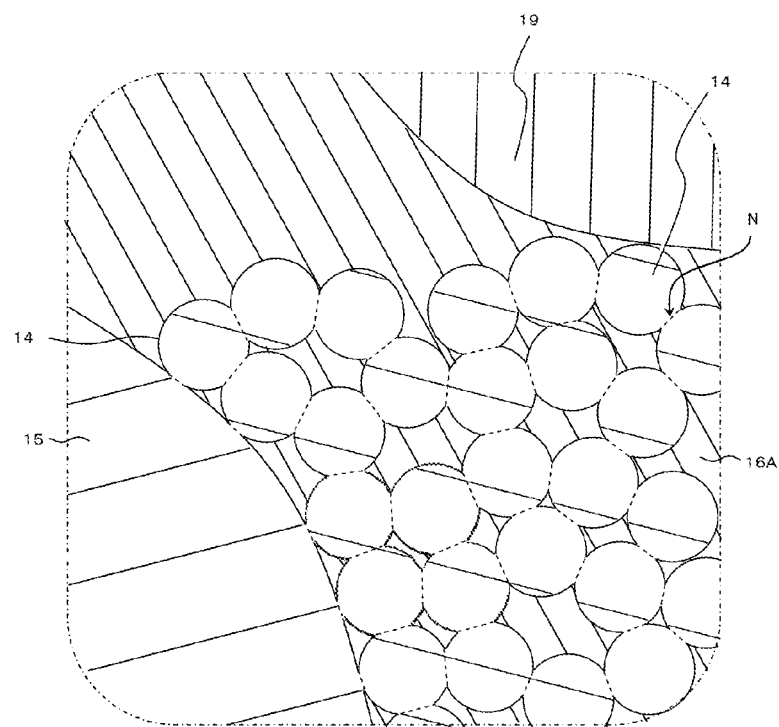
FIG. 3 is a cross-sectional view cut in the thickness direction in which a part R2 in FIG. 2 is enlarged.
Figure 3:
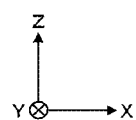

The inorganic insulating layer 11A is a layer to increase the Young's modulus of the base 7 and to reduce the thermal expansion coefficient of the base 7. The inorganic insulating layer 11A is formed of an inorganic insulating portion having an inorganic insulating material as a main component and includes gaps G formed in the inorganic insulating portion. Further, as illustrated in FIG. 2, a part of the first resin layer 12A and a part of the second resin layer 13A described below are located inside the gaps G.

The thickness of the inorganic insulating layer 11A is, for example, 3 μm or more and 100 μm or less, and this range corresponds to, for example, 5% or more and 50% or less of the thickness of the first resin layer 12A. Further, the Young's modulus of the inorganic insulating layer 11A is, for example, 20 GPa or more and 50 GPa or less. In addition, the thermal expansion coefficient of the inorganic insulating layer 11A in the plane direction is, for example, 0 ppm/° C. or more and 10 ppm/° C. or less. In addition, the Young's modulus of the inorganic insulating layer 11A is measured by a measurement method in conformity with ISO 527-1: 1993 using a nano indenter.

The content ratio of the inorganic insulating portion in the inorganic insulating layer 11A is, for example, 62% by volume or more and 75% by volume or less. The content ratio of the gaps G in the inorganic insulating layer 11A is, for example, 25% by volume or more and 38% by volume or less. Further, the content ratio of a part of the first resin layer 12A and a part of the second resin layer 13A in the gaps G is, for example, 99.5% by volume or more and 100% by volume or less. Moreover, the width of the gap G is, for example, 10 nm or more and 300 nm or less. In addition, the width of the gap G can be obtained by observing the cross section of the inorganic insulating layer 11A using a scanning electron microscope or a transmission electron microscope, photographing the cross section enlarged so as to include 20 or more and 50 or less of gaps G, and regarding the average value of the maximum diameters of gaps G in the enlarged cross section as the width of the gap G.

The inorganic insulating portion includes a plurality of first inorganic insulating particles 14 made of an inorganic insulating material. As a result, since the thermal expansion coefficient of an inorganic insulating material is smaller than that of a resin material, the thermal expansion coefficient of the inorganic insulating portion is small. Therefore, when the first resin layer 12A and the second resin layer 13A formed on both main surfaces of the inorganic insulating layer 11A thermally expand, the inorganic insulating layer 11A restrains the first resin layer 12A and the second resin layer 13A and can reduce the thermal expansion coefficient of the base 7.

Moreover, the plurality of first inorganic insulating particles 14 included in the inorganic insulating portion are bound to each other at a part of each of the first inorganic insulating particles so as to form a neck N, and the gaps G surrounded by the first inorganic insulating particles 14 which are bound to each other are formed. Further, a part of the first resin layer 12A and a part of the second resin layer 13A are located inside the gaps G. As a result, the adhesive strength between a part of the first resin layer 12A, the second resin layer 13A, and the inorganic insulating layer 11A can be improved. Therefore, it is possible to reduce peeling off of the first resin layer 12A and the second resin layer 13A from the inorganic insulating layer 11A.

Further, as illustrated in FIG. 2, since the plurality of first inorganic insulating particles 14 are bound to each other, the plurality of first inorganic insulating particles 14 restrain each other. As a result, it is possible to improve the Young's modulus of the inorganic insulating layer 11A. Accordingly, when the first resin layer 12A and the second resin layer 13A thermally expand, it is possible for the inorganic insulating layer 11A to sufficiently restrain the first resin layer 12A and the second resin layer 13A and to further reduce the thermal expansion coefficient of the base 7.

The first inorganic insulating particles 14 are made of an inorganic insulating material such as silicon oxide, aluminum oxide, magnesium oxide, or calcium oxide. Among these, it is preferable to use silicon oxide. Since silicon oxide has a low dielectric loss tangent compared to those of other inorganic insulating materials, signal transmission characteristics of the conductive layer 8A can be improved. In addition, it is preferable to use an amorphous material for the first inorganic insulating particles 14. As a result, anisotropy of the thermal expansion coefficient caused by the crystalline structure of the first inorganic insulating particles 14 can be reduced and thereby generation of cracks in the inorganic insulating layer 11A can be reduced.

The average particle diameter of the first inorganic insulating particles 14 is, for example, 3 nm or more and 110 nm or less. The Young's modulus of the first inorganic insulating particles 14 is, for example, 10 GPa or more and 100 GPa or less. The thermal expansion coefficient of the first inorganic insulating particles 14 is, for example, 0.5 ppm/° C. or more and 15 ppm/° C. or less. Further, the average particle diameter of the first inorganic insulating particles 14 is measured by observing a polished surface or a fractured surface of the inorganic insulating layer 11A using a field emission electron microscope, photographing the cross section enlarged to include 20 or more and 50 or less of particles, measuring maximum diameters of particles on the enlarged cross section, and averaging the diameters. Hereinafter, the average particle diameter of each member is measured in the same manner as that of the first inorganic insulating particles 14 except the case particularly described.

It is preferable that the inorganic insulating portion include the second inorganic insulating particles 15 whose average particle diameter is greater than that of the first inorganic insulating particles 14. In this case, the inorganic insulating portion is formed by combining the plurality of first inorganic insulating particles 14 with each other, and combining the first inorganic insulating particles 14 and the second inorganic insulating particles 15 at a part of each of the particles. As a result, since the average particle diameter of the second inorganic insulating particles 15 is greater than that of the first inorganic insulating particles 14, when cracks are generated in the inorganic insulating portion, elongation of the cracks can be suppressed because a large amount of energy is necessary for the cracks to bypass the second inorganic insulating particles 15.

The second inorganic insulating particles 15 are made of, for example, a material which is similar to those of the first inorganic insulating particles 14 and have similar characteristics. Here, it is preferable to use a material which is the same as that of the first inorganic insulating particles 14 for the second inorganic insulating particles 15. The average particle diameter of the second inorganic insulating particles 15 is, for example, 0.5 μm or more and 5 μm or less. Further, the average particle diameter of the second inorganic insulating particles 15 can be obtained by observing the cross section of the inorganic insulating layer 11A using a scanning electron microscope or a transmission electron microscope, focusing at least 30 particles in the cross section, polishing cross sections of the respective particles by 0.2 μm, measuring the particle diameters of these particles in respective polished cross sections, regarding the maximum value among the diameters of each focused particle as a diameter of the particle, and calculating the average value of the diameters of the respective particles. Next, the average value is measured on at least 30 arbitrarily selected cross sections and the average values calculated in respective cross sections are further averaged to calculate the average particle diameter thereof.

The content ratio of the first inorganic insulating particles 14 in the inorganic insulating portion is, for example, 20% by volume or more and 90% by volume or less. The content ratio of the second inorganic insulating particles 15 in the inorganic insulating portion is, for example, 10% by volume or more and 80% by volume or less.

On the other hand, the first resin layer 12A forms a principal part of the base 7. The first resin layer 12A includes a first resin portion 16A, a base material 17 being covered by the first resin portion 16A, and filler particles 19 being covered by the first resin portion 16A. A part of the first resin portion 16A is located inside the gaps G and thereby a part of the first resin layer 12A being located inside the gaps G.

The thickness of the first resin layer 12A is, for example, 0.01 mm or more and 0.3 mm or less. The Young's modulus of the first resin layer 12A is, for example, 0.2 GPa or more and 20 GPa or less. The thermal expansion coefficient of the first resin layer 12A in the plane direction is, for example, 3 ppm or more and 20 ppm or less. The content ratio of the base material 17 in the first resin layer 12A is, for example, 20% by volume or more and 50% by volume or less. The content ratio of the filler particles 19 in the first resin layer 12A is, for example, 10% by volume or more and 40% by volume or less.

The first resin portion 16A forms a principal part of the first resin layer 12A and is made of a resin material such as an epoxy resin, a bis-maleimide triazine resin, or a cyanate resin. The Young's modulus of the first resin potion 16A is, for example, 0.1 GPa or more and 5 GPa or less. The thermal expansion coefficient of the first resin portion 16A is, for example, 20 ppm/° C. or more and 50 ppm/° C. or less.

Here, the first resin portion 16A is located inside the gaps G of the inorganic insulating layer 11A. As a result, since the Young's modulus of the first resin portion 16A is smaller than those of the first inorganic insulating particles 14 and the second inorganic insulating particles 15, the stress applied to the inorganic insulating layer 11A can be relaxed and generation or elongation of cracks in the inorganic insulating layer 11A can be reduced by the first resin portion 16A.

The Young's modulus of the first resin layer 12A is improved and the thermal expansion coefficient of the first resin layer 12A in the plane direction is decreased by the base material 17. A material in which woven fabric made of fibers, non-woven fabric, or fibers are arranged in one direction can be used for the base material 17, for example, and the fibers may be glass fibers, resin fibers, carbon fibers, or metal fibers. The Young's modulus of the base material 17 is, for example, 10 GPa or more and 25 GPa or less. The thermal expansion coefficient of the base material 17 in the plane direction is, for example, 2 ppm/° C. or more and 25 ppm/° C. or less.

The filler particles 19 are dispersed into the first resin layer 12A, improve the Young's modulus of the first resin layer 12A, and reduce the thermal expansion coefficient of the first resin layer 12A. The filler particles 19 are made of an inorganic insulating material such as silicon oxide, aluminum oxide, aluminum nitride, aluminum hydroxide, or calcium carbonate. The average particle diameter of the filler particles 19 is, for example, 0.3 µm or more and 5 µm or less. The Young's modulus of the filler particles 19 is, for example, 40 GPa or more and 90 GPa or less. The thermal expansion coefficient of the filler particles 19 is, for example, 0 ppm/° C. or more and 15 ppm/° C. or less.

The second resin layer 13A is a layer to support the above-described conductive layer 3A. The second resin layer 13A includes a second resin portion 18A and filler particles 19 being covered by the second resin portion 18A and dispersed into the second resin layer 13A. A part of the second resin portion 18A is located inside the gaps G and thereby a part of the second resin layer 13A being located inside the gaps G. The thickness of the second resin layer 13A is, for example, 3 µm or more and 20 µm or less. The Young's modulus of the second resin layer 13A is, for example, 0.2 GPa or more and 20 GPa or less. The thermal expansion coefficient of the second resin layer 13A in the plane direction is, for example, 20 ppm/° C. or more and 70 ppm/° C. or less. The content ratio of the filler particles 19 in the second resin layer 13A is, for example, 10% by volume or more and 70% by volume or less.

The second resin portion 18A is made of, for example, a material which is similar to those of the first resin portion 16A and has similar characteristics. In addition, the second resin portion 18A is located inside the gaps G of the inorganic insulating layer 11A. As a result, the stress applied to the inorganic insulating layer 11A can be relaxed by the second resin portion 18A in the same manner as by the first resin portion 16A.

The conductive layer 8A disposed on both main surfaces of the above-described base 7 is made of a conductive material such as copper, silver, gold, or aluminum. The thickness of the conductive layer 8A is, for example, 3 µm or more and 20 µm or less. The Young's modulus of the conductive layer 8A is, for example, 80 GPa or more and 200 GPa or less. The thermal expansion coefficient of the conductive layer 8A in the plane direction is, for example, 16 ppm/° C. or more and 18 ppm/° C. or less.

The through-hole conductor 9 penetrates the base 7 in the thickness direction and electrically connects the pair of the conductive layers 8A formed on both the main surfaces of the base 7. The through-hole conductor 9 is made of, for example, a material which is the same as that of the conductor layer 8A and has similar characteristics. The through-hole conductor 9 is formed in a form of a cylinder along an inner wall of a columnar through-hole T penetrating the base 7 in the thickness direction. The diameter of the through-hole T is, for example, 0.1 mm or more and 1 mm or less. The insulator 10 made of a resin material such as an epoxy resin is disposed in the inside of the cylindrical through-hole conductor 9. In addition, the through-hole T may be filled with the through-hole conductor 9.

The wiring layer 6 disposed on both main surfaces of the above-described core board 5 includes an inorganic insulating layer 11B, a first resin layer 12B formed on one main surface of the inorganic insulating layer 11B, a second resin layer 13B formed on another main surface of the inorganic insulating layer 11B, a conductive layer 8B formed on a main surface of the second resin layer 13B, the one main surface being on an opposite side to the inorganic insulating layer 11B, a third resin layer 20 covering the conductive layer 8B, and a via conductor 21 electrically connecting conductive layers 8B to each other in the thickness direction.

The inorganic insulating layer 11B improves the Young's modulus of the wiring layer 6 and reduces the thermal expansion coefficient of the wiring layer 6. The inorganic insulating layer 11B is made of a material which is similar to that of the inorganic insulating layer 11A and has similar structure and characteristics. A part of the first resin layer 12B and a part of the second resin layer 13B are located inside the gaps G of the inorganic insulating layer 11B.

The first resin layer 12B functions as an adhesive layer between the inorganic insulating layer 11B and other members. The first resin layer 12B includes, for example, the first resin portion 16B and the filler particles 19 being covered by the first resin portion 16B, is made of, for example, a material which is similar to that of the second resin layer 13A, and has similar structure and characteristics. A part of the first resin portion 16B is located inside the gaps G and thereby a part of the first resin layer 12B being located inside the gaps G.

The second resin layer 13B supports the conductive layer 8B. The second resin layer 13B includes the second resin portion 18B and the filler particles 19 being covered by the second resin portion 18B and dispersedly positioned. The second resin layer 13B is made of, for example, a material which is similar to that of the second resin layer 13A and has similar structure and characteristics. A part of the second resin portion 18B is located inside the gaps G and thereby a part of the second resin layer 12B being located inside the gaps G.

The conductive layer 8B is partially formed on a main surface of the second resin layer 13B on the opposite side to the inorganic insulating layer 11B and functions as a grounding wire, a power supply wire, or a signal wire. The conductive layer 8B is made of a material which is similar to that of the conductive layer 8A and has similar structure and characteristics.

The third resin layer 20 covers the conductive layer 8B partially formed on the second resin layer and reduces a short circuit between conductive layers 8B in the plane direction. The third resin layer 20 has a structure similar to that of the first resin layer 12B. In addition, as illustrated in FIG. 1, the first resin layer 12B and the third resin layer 20 are insulating layers which are similar to each other, however a layer which is in direct contact with the inorganic insulating layer 11 is the first resin layer 12B and a layer which is not in direct contact with the inorganic insulating layer 11 is the third resin layer 20 when a certain layer of the inorganic insulating layer 11 is focused on.

The via conductor 21 electrically connects a plurality of conductive layers 8B to one another in the thickness direction and penetrates the first resin layer 12B, the inorganic insulating layer 11B, and the second resin layer 13B. The via conductor 21 is made of a material which is similar to that of the conductive layer 8A and has similar structure and characteristics.

As described above, the second resin layer 13 is interposed between the inorganic insulating layer 11 and the conductive layer 8. As a result, since the Young's modulus of the second resin layer 13 is smaller than those of the inorganic insulating layer 11 and the conductive layer 8 when compared to the case in which the conductive layer 8 is directly formed on the inorganic insulating layer 11, the thermal stress caused by a difference between the thermal expansion coefficient of the inorganic insulating layer 11 and the thermal expansion coefficient of the conductive layer 8 can be relaxed and peeling off of the conductive layer 8 from the inorganic insulating layer 11 can be reduced.

Moreover, since the second resin portion 18 is located inside the gaps G of the inorganic insulating layer 11, an anchor effect is generated and the contact area between the second resin layer 13 and the plurality of first inorganic insulating particles 14 and the plurality of second inorganic insulating particles 15 included in the inorganic insulating layer 11 becomes large. As a result, since the adhesive strength of the second resin layer 13 and the inorganic insulating layer 11 is improved, peeling off of the conductive layer 8 from the inorganic insulating layer 11 can be sufficiently reduced.

In addition, the first resin layer 12 and the second resin layer 13 whose Young's moduli are smaller than that of the inorganic insulating layer 11 are formed on both the main surfaces of the inorganic insulating layer 11. As a result, when stress is applied to the wiring board 3, since the first resin layer 12 and the second resin layer 13 are deformed and the stress applied to the inorganic insulating layer 11 can be relaxed, generation of cracks in the inorganic insulating layer 11 can be reduced and disconnection of the conductive layer 8 caused by the cracks can be sufficiently reduced.

In addition, a part of the first resin layer 12 and a part of the second resin layer 13 are located inside the gaps G of the inorganic insulating layer 11. As a result, since peeling off of the first resin layer 12 and the second resin layer 13 from the inorganic insulating layer 11 can be sufficiently reduced, migration to be generated between the conductive layers 8, between the through-hole conductors 9, or between via conductors 21 which are adjacent to each other in the plane direction can be sufficiently reduced.

Figure 4:
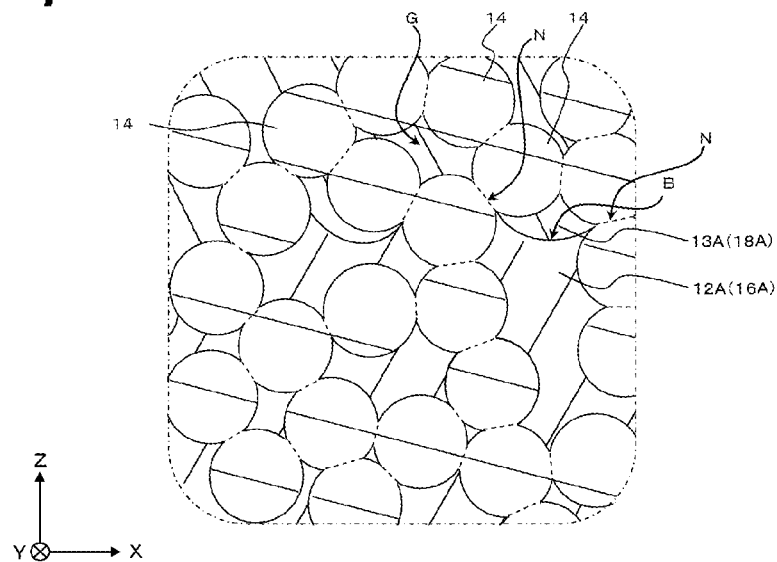
FIG. 4 is a cross-sectional view cut in the thickness direction in which a part R3 in FIG. 2 is enlarged.
Figure 5:
FIGS. 5(a) to 5(c) are cross-sectional views cut in the thickness direction in which a step of manufacturing the mounting structure illustrated in FIG. 1 is described.
Figure 5:
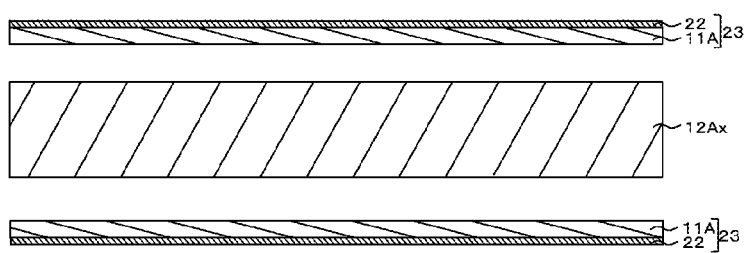
Figure 5:
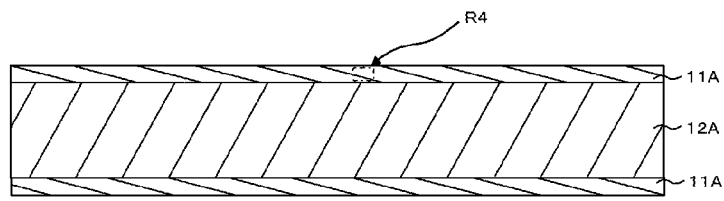

Further, as illustrated in FIG. 4, it is preferable that the first resin layer 12 and the second resin layer 13 located inside the gaps G be disposed in contact with each other in the gaps G. As a result, since the gaps G are filled with a part of the first resin layer 12 and a part of the second resin layer 13, migration to be generated between the through-hole conductors 9 and between the via conductors 21 adjacent to each other in the plane direction can be sufficiently reduced.

Moreover, as illustrated in FIG. 4, it is preferable that the first resin layer 12 and the second resin layer 13 located inside the gaps G be disposed in contact with each other, the surfaces of which are curved, in the gaps G. As a result, since the contact area between the first resin layer 12 and the second resin layer 13 becomes large, the adhesive strength can be improved. Therefore, since peeling off between the first resin layer 12 and the second resin layer 13 located inside the gaps G can be sufficiently reduced, the migration to be generated between the through-hole conductors 9 and between the via conductors 21 adjacent to each other in the plane direction can be sufficiently reduced. In addition, when the wiring board 3 is heated, swelling caused by moisture entering a peeled-off area can be reduced.

Moreover, as illustrated in FIG. 2, in the second resin layer 13, it is preferable that the content ratio of the filler particles 19 in an area of a side of the conductor layer 8 be smaller than that of the filler particles 19 in an area of a side of the inorganic insulating layer 11. As a result, a difference between the thermal expansion coefficient of the area of the second resin layer 13 on the inorganic insulating layer 11 side and the thermal expansion coefficient of the inorganic insulating layer 11 can be reduced, and the thermal expansion coefficients of the area of the second resin layer 13 on the conductive layer 8 side and the conductive layer 8 can be reduced. Therefore, peeling off between the second resin layer 13 and the inorganic insulating layer 11 can be reduced and peeling off between the second resin layer 13 and the conductive layer 8 can be sufficiently reduced.

In addition, when the second resin layer 13 positioned on one main surface of the inorganic insulating layer 11 is divided into two parts in the plane direction such that the thicknesses thereof become equivalent and an area closer to the inorganic insulating layer 11 is set to a first area and an area closer to the conductive layer 8 is set to a second area, the ratio of the number of the filler particles 19 positioned in the first area to the filler particles 19 in the second resin layer 13 is, for example, 55% or more and 70% or less, and the ratio of the number of the filler particles 19 positioned in the second area to the filler particles 19 in the second resin layer 13 is, for example, 30% or more and 45% or less.

Further, it is preferable that the third resin layer 20 be made of a material which is the same as that of the second resin layer 13. As a result, since the adhesive strength of the second resin layer 13 and the third resin layer 20 can be improved, peeling off between the second resin layer 13 and the third resin layer 20 can be reduced.

Moreover, as illustrated in FIG. 2, in the third resin layer 20, it is preferable that the content ratio of the filler particles 19 in an area of a side of the conductor layer 8 be smaller than that of the filler particles 19 in an area of an opposite side to the conductive layer 8. As a result, since a difference between the thermal expansion coefficient of the area of the third resin layer 20 on the conductive layer 8 side and the thermal expansion coefficient of the area of the second resin layer 13 on the conductive layer 8 side can be reduced, peeling off between the second resin layer 13 and the third resin layer 20 can be reduced.

In addition, when the third resin layer 20 positioned on one main surface of the inorganic insulating layer 11 is divided into two parts in the plane direction such that the thicknesses thereof become equivalent and an area farther from the conductive layer 8 is set to a first area and an area closer to the conductive layer 8 is set to a second area, the ratio of the number of the filler particles 19 positioned in the first area to the filler particles 19 in the third resin layer 20 is, for example, 55% or more and 70% or less, and the ratio of the number of the filler particles 19 positioned in the second area to the filler particles 19 in the third resin layer 20 is, for example, 30% or more and 45% or less.

Further, as illustrated in FIG. 2, in the inorganic insulating layer 11, the content ratio of the second inorganic insulating particles 15 in an area on the second resin layer 13 side may be larger than that of the second inorganic insulating particles 15 in the area on the first resin layer 12 side. As a result, since the hardness on the surface aide of the wiring board 3 is increased as compared to that on the inside of the wiring board 3, it is possible to suppress generation of cracks in the wiring base 3.

<Method of Manufacturing a Mounting Structure>

Hereinafter, the method of manufacturing the above-described mounting structure 1 will be described with reference to FIGS. 5 to 12.

(1) An inorganic insulating sol 11x including a solid content which has the first inorganic insulating particle 14 and the second inorganic insulating particle 15 and a solvent to which the solid content is dispersed is prepared.

The content ratio of the solid content in the inorganic insulating sol 11x is, for example, 10% by volume or more and 50% by volume or less. The viscosity of the inorganic insulating sol 11x can be reduced by the content ratio thereof being 10% by volume or more and the manufacturability of the inorganic insulating layer 11 made of the inorganic insulating sol 11x can be improved by the content ratio thereof being 50% by volume or less. The content ratio of the solvent in the inorganic insulating sol 11x is, for example, 50% by volume or more and 90% by volume or less.

The content ratio of the first inorganic insulating particles 14 to the solid content of the inorganic insulating sol 11x is, for example, 20% by volume or more and 90% by volume or less and the content ratio of the second inorganic insulating particles 15 to the solid content of the inorganic insulating sol 11x is, for example, 10% by volume or more and 80% by volume or less. Accordingly, generation of cracks in the inorganic insulating layer 11 can be effectively reduced in a step (3) described below.

Examples of the solvent to be included in the inorganic insulating sol 11x include methanol, isopropanol, n-butanol, ethylene glycol, ethylene glycol monopropyl ether, methyl ethyl ketone, methyl isobutyl ketone, xylene, propylene glycol monomethyl ether, propylene glycol monomethyl ether acetate, dimethyl acetoamide, and/or an organic solvent including a mixture of two or more materials selected from the above.

(2) As illustrated in FIG. 5(a), a support sheet 22 made of a resin material such as a PET resin or a metal material such as copper is prepared and one main surface of the support sheet 22 is coated with the inorganic insulating sol 11x.

The inorganic insulating sol 11x can be applied using, for example, a dispenser, a bar coater, a die coater, or screen printing.

(3) The solvent is evaporated by drying the inorganic insulating sol 11x.

Here, the inorganic insulating sol 11x is contracted in accordance with evaporation of the solvent, but the solvent is included in the gaps G surrounded by the first inorganic insulating particles 14 and the second inorganic insulating particles 18 and is not included in the first inorganic insulating particles 14 and the second inorganic insulating particles 18. Therefore, when the inorganic insulating sol 11x includes the second inorganic insulating particles 15 whose average particle diameter is large, the gaps G become smaller and an area filled with the solvent becomes smaller and an amount of contraction of the solid content of the inorganic insulating sol 11x at the time of evaporation of the solvent of the inorganic insulating sol 11x becomes smaller. As a result, generation of cracks to be caused by the contraction of the solid content of the inorganic insulating sol 11x can be reduced. Further, even when cracks are generated, elongation of cracks can be suppressed by the second inorganic insulating particles 15 whose average particle diameter is large.

Drying of the inorganic insulating sol 11x can be performed by heating and air-drying. The drying temperature is, for example, 20° C. or higher and lower than a boiling point of a solvent (a boiling point of a solvent with the lowest boiling point in a case where two or more kinds of solvents are mixed) and the drying time is, for examples, 20 seconds or more and 30 minutes or less.

(4) A solid content of the remaining inorganic insulating sol 11x is heated and an inorganic insulating layer 11 in which the first inorganic insulating particles 14, and the first inorganic insulating particles 14 and the second inorganic insulating particles 15 are bound to each other at a part of the particles is prepared.

Here, the inorganic insulating sol 11x in the present embodiment includes the first inorganic insulating particles 14 whose average particle diameter is small. As a result, even when the heating temperature of the inorganic insulating sol 11x is relatively low, for example, lower than the crystallization starting temperature of the first inorganic insulating particles 14 and the second inorganic insulating particles 15, the first inorganic insulating particles 14 can be rigidly bound to each other.

It is preferable that the heating temperature of the inorganic insulating sol 11x be lower than the crystallization starting temperature of the first inorganic insulating particles 14 and the second inorganic insulating particles 15. As a result, contraction of crystallized particles due to phase transition can be reduced and generation of cracks in the inorganic insulating layer 11 can be reduced.

Further, by heating the inorganic insulating sol at a low temperature in the above-described manner, the shapes of particles of the first inorganic insulating particles 14 and the second inorganic insulating particles 15 can be maintained and only areas proximity to each other between the first inorganic insulating particles 14 and between the first inorganic insulating particles 14 and the second inorganic insulating particles 15 can be bound. As a result, the first inorganic insulating particles 14 can be bound to each other and the first inorganic insulating particles 14 and the second inorganic insulating particles 15 can be bound to each other, and the gaps G which are open pores can be easily formed between the first inorganic insulating particles 14.

Further, the temperature that allows the first inorganic insulating particles 14 to be rigidly bound to each other is, for example, approximately 250° C. in a case where the average particle diameter of the first inorganic insulating particles 14 is 110 nm or less and is approximately 150° C. in a case where the average particle diameter thereof is 15 nm or less. Further, the crystallization starting temperature of silicon oxide included in the first inorganic insulating particles 14 and the second inorganic insulating particles 18 is approximately 1300° C.

The heating temperature of the inorganic insulating sol 11x is, for example, 100° C. or higher and lower than 700° C. and the heating time thereof is, for example, 0.5 hours or more and 24 hours or less.

As described below, a laminated sheet 23 including the support sheet 22 and the inorganic insulating layer 11 formed on one main surface of the support sheet 22 is prepared.

(5) As illustrated in FIG. 5(b), the first resin precursor 12Ax including uncured first resin material 16Ax, the base material 17 covered by the uncured first resin material 16A, and the filler particles 19 covered by the uncured first resin material 16Ax is prepared and the inorganic insulating layer 11A of the laminated sheet 23 is laminated on both main surfaces of the first resin precursor 12Ax.

Figure 6:
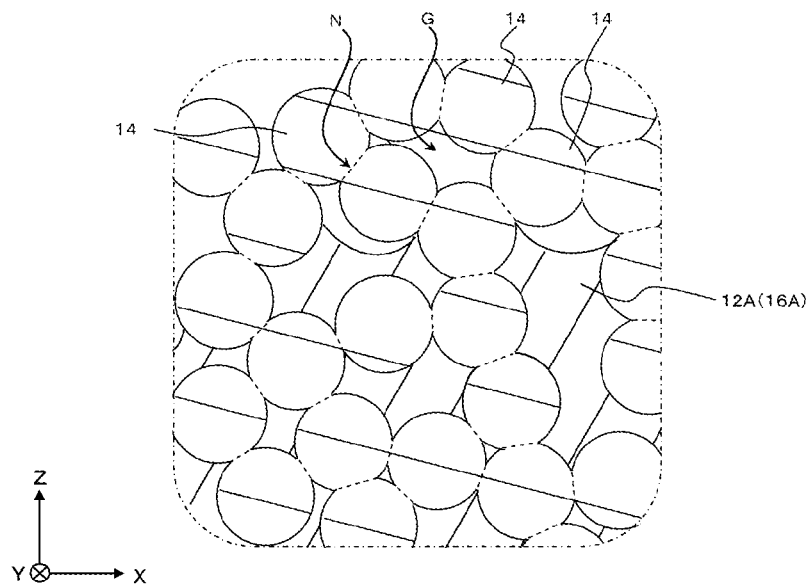
FIG. 6 is a cross-sectional view cut in the thickness direction in which a part R4 in FIG. 5(c) is enlarged.
Figure 7:
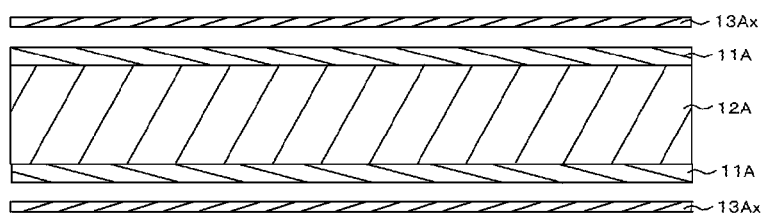
FIGS. 7(a) and 7(b) are cross-sectional views cut in the thickness direction in which a step of manufacturing the mounting structure illustrated in FIG. 1 is described.
Figure 7:
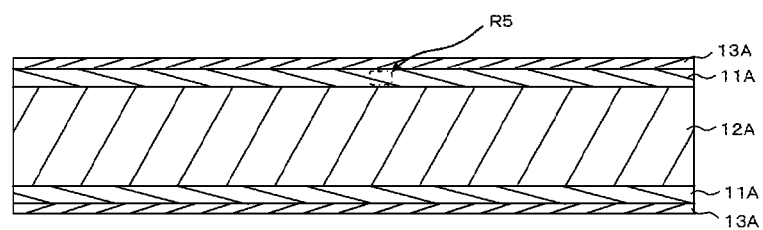

Next, as illustrated in FIG. 5(c), the first resin layer 12A is formed by heating and pressing the inorganic insulating layer 11A and the first resin precursor 12Ax and allowing the uncured first resin material 16Ax to be cured. At this time, as illustrated in FIG. 6, the uncured first resin material 16Ax is located inside a part of the gaps G of the inorganic insulating layer 11A, the first resin material 16Ax is cured and becomes the first resin portion 16A, and a part of the first resin layer 12A is located inside the inorganic insulating layer 11A. Subsequently, the support sheet 22 is peeled off from the inorganic insulating layer 11A and one main surface of the inorganic insulating layer 11A is exposed. Here, the uncured resin is a resin in a state of an A-stage or a B-stage in conformity with ISO 472:1999.

The heating and pressing of the inorganic insulating layer 11A and the first resin precursor 12Ax are performed at a temperature lower than the curing starting temperature of the uncured first resin material 16Ax until the uncured first resin material 16Ax is located inside the gaps G of the inorganic insulating layer 11A. As a result, the uncured first resin material 16Ax is fluidized and efficiently enters the gaps G of the inorganic insulating layer 11A. Thereafter, the heating and pressing are performed at a temperature of the curing starting temperature or higher and lower than the thermal decomposition temperature of the uncured first resin material 16Ax. As a result, the first resin material 16Ax located inside the gaps G of the inorganic insulating layer 11A is cured and becomes the first resin portion 16A.

In regard to the heating and pressing performed at the temperature lower than the curing starting temperature of the first resin material 16Ax, the heating temperature is, for example, 110° C. or higher and 180° C. or lower and the applied pressure is, for example, 2 MPa or more and 3 MPa or less and the heating time is, for example, 0.5 hours or more and 2 hours or less. In the heating and pressing performed thereafter, the heating temperature is, for example, 190° C. or higher and 230° C. or lower, the applied pressure is, for example, 2 MPa or more and 3 MPa or less, and the heating time is, for example, 0.5 hours or more and 2 hours or less. Further, the curing starting temperature is a temperature at which a resin is in a state of a C-stage in conformity with ISO 472:1999. In addition, the thermal decomposition temperature is a temperature at which the mass of the resin is decreased by 5% in thermogravimetric measurement in conformity with ISO 11358:1997.

(6) As illustrated in FIG. 7(a), the second resin precursor 13Ax including the uncured second resin material 18Ax and the filler particles 19 covered by the uncured second resin material 18Ax is prepared and then laminated on the main surface of the inorganic insulating layer 11A, the main surface being on an opposite side to the first resin layer 12A and on both main surfaces of the second resin precursor 13A.

Figure 8:
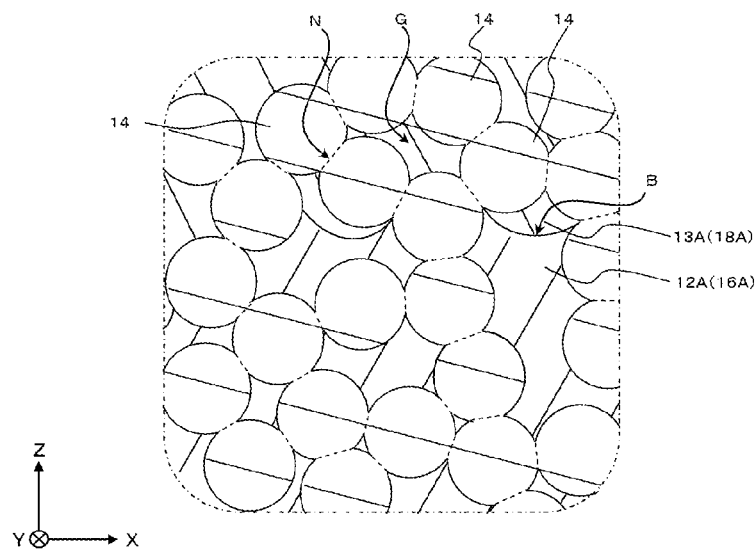
FIG. 8 is a cross-sectional view cut in the thickness direction in which a part R5 in FIG. 7(b) is enlarged.

Next, as illustrated in FIG. 7(b), the second resin layer 13A is formed by heating and pressing the first resin layer 12A, the inorganic insulating layer 11A, and the second resin precursor 13Ax and allowing the uncured second resin material 18Ax to be cured. At this time, as illustrated in FIG. 8, the uncured second resin material 18Ax is located inside a part of the gaps G of the inorganic insulating layer 11A, the second resin material 18Ax is cured and becomes the second resin portion 18A, and a part of the second resin layer 13A is located inside the inorganic insulating layer 11A.

The heating and pressing of the first resin layer 12A, the inorganic insulating layer 12A, and the second resin precursor 13Ax are performed at a temperature lower than the curing starting temperature of the uncured second resin material 18Ax until the uncured second resin material 18Ax is located inside the gaps G of the inorganic insulating layer 11A. At this time, the uncured second resin material 18Ax is fluidized and efficiently enters the gaps G of the inorganic insulating layer 11A. Thereafter, the heating is performed at a temperature of the curing starting temperature of the uncured second resin material 18Ax or higher and lower than the thermal decomposition temperature of the first resin material 16A and the second resin material 18A. As a result, the second resin material 18Ax located inside the gaps G of the inorganic insulating layer 11A is cured and becomes the second resin portion 18A.

In regard to the heating and pressing of the first resin layer 12A, the inorganic insulating layer 11A, and the second resin precursor 13Ax, the heating temperature is, for example, 90° C. or higher and 160° C. or lower and the applied pressure is, for example, 0.1 MPa or more and 2 MPa or less. Further, the heating performed thereafter is performed in an air atmosphere, the heating temperature is, for example, 190° C. or higher and 230° C. or lower, and the heating time is, for example, 0.5 hours or more and 2 hours or less.

Figure 9:
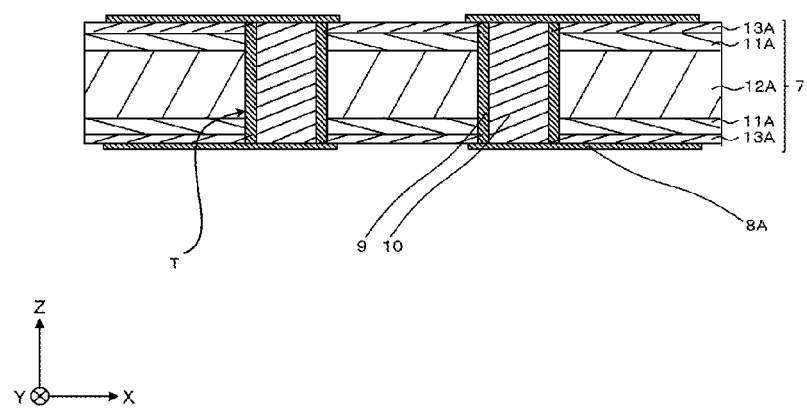
FIG. 9 is a cross-sectional view describing a step of manufacturing the mounting structure illustrated in FIG. 1.
Figure 10:
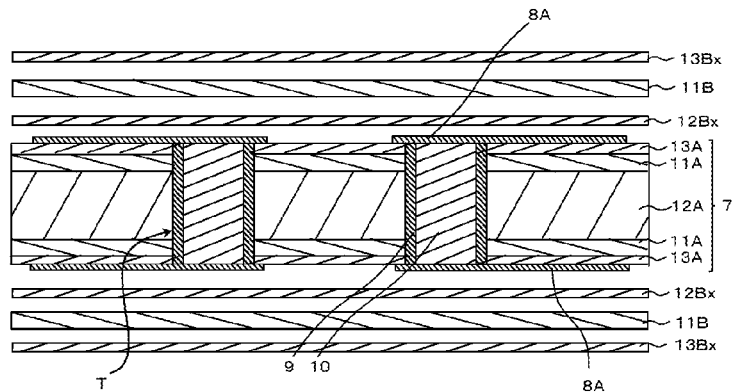
FIGS. 10(a) and 10(b) are cross-sectional views cut in the thickness direction in which a step of manufacturing the mounting structure illustrated in FIG. 1 is described.
Figure 10:
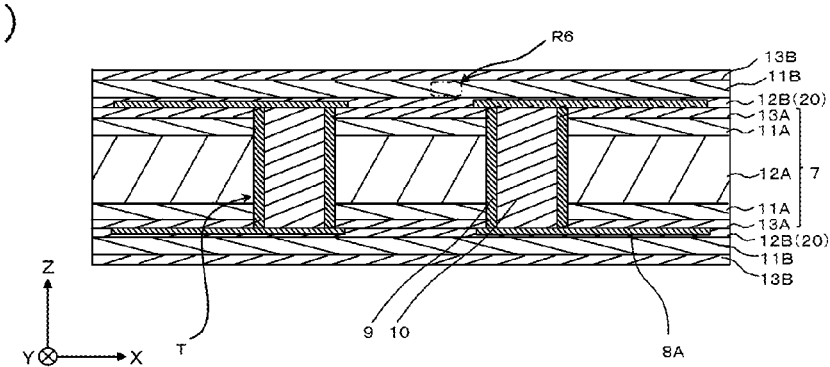

(7) As illustrated in FIG. 9, the through-hole conductor 9 penetrating the base 7 in the thickness direction is formed and the conductive layer 8A is formed on the base 7. Specifically, this step will be performed as described below.

First, a plurality of through-holes T penetrating the base 7 in the thickness direction are formed by, for example, drilling or laser machining. Next, a conductive material is adhered to the inner wall of the through-hole T and a cylindrical through-hole conductor 9 is formed by, for example, electroless plating, a vapor deposition method, a CVD method, or a sputtering method. Subsequently, the inside of the cylindrical through-hole conductor 9 is filled with a resin material or the like and the insulator 10 is formed. Next, the conductive material is adhered to an exposed portion of the insulator 10 by, for example, the electroless plating, the vapor deposition method, the CVD method, or the sputtering method. Next, a conductive layer 8A is formed by performing patterning on the adhered conductive material using a photolithography technique and etching.

As described above, the core board 5 is prepared.

(8) As illustrated in FIG. 10(a), the first resin precursor 12Bx including the uncured first resin material 16Bx and the filler particles 19 covered by the uncured first resin material 16Bx is laminated on the conductive layer 8A. Next, the inorganic insulating layer 11B is laminated on the main surface of the first resin precursor 12Bx, the main surface being on an opposite side to the conductive layer 8A. Next, the second resin precursor 13Bx including the uncured second resin material 18Bx and the filler particles 19 covered by the uncured second resin material 18Bx is laminated on the main surface of the inorganic insulating layer 11B, the main surface being on an opposite side to the first resin precursor 12Bx.

Figure 11:
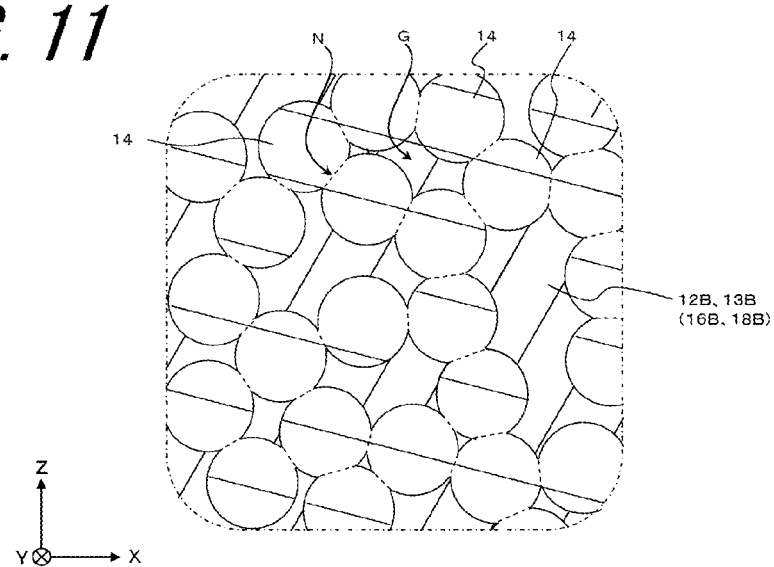
FIG. 11 is a cross-sectional view cut in the thickness direction in which a part R6 in FIG. 10(b) is enlarged.
Figure 12:
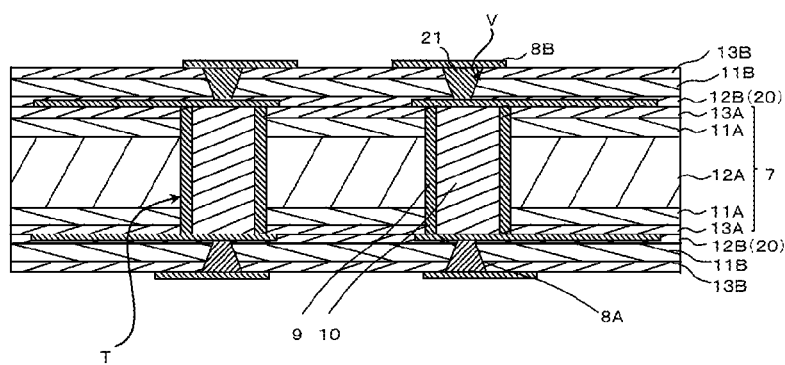
FIGS. 12(a) and 12(b) are cross-sectional views cut in the thickness direction in which a step of manufacturing the mounting structure illustrated in FIG. 1 is described.
Figure 12:
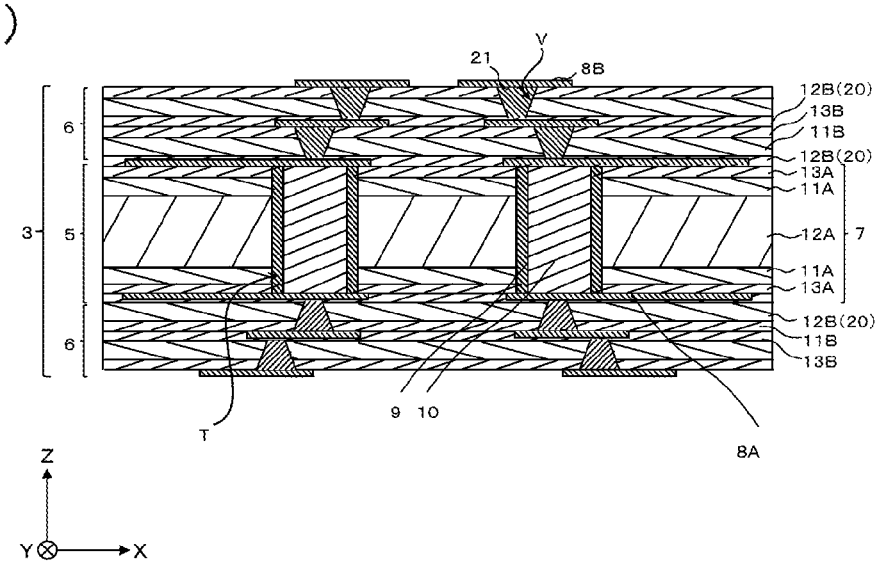

Subsequently, as illustrated in FIG. 10(b), the first resin layer 12B and the second resin layer 13B are formed by heating and pressing the first resin precursor 12Bx, the inorganic insulating layer 11B, and the second resin precursor 13Bx at the same time and allowing the uncured first resin material 16Bx and the uncured second resin material 18Bx to be cured. At this time, as illustrated in FIG. 11, the uncured first resin material 16Bx and the uncured second resin material 18Bx are located inside the gaps G of the inorganic insulating layer 11B, the first resin material 16Bx and the second resin material 18Bx are cured and became the first resin portion 16B and the second resin portion 18B respectively, and a part of the first resin layer 12B and a part of the second resin layer 13B are located inside the inorganic insulating layer 11B.

The heating and pressing of the first resin precursor 12Bx, the inorganic insulating layer 11B, and the second resin precursor 13Bx are performed at a temperature lower than the curing starting temperature of the uncured first resin material 16Bx and the uncured second resin material 18Bx until the uncured first resin material 16Bx and the uncured second resin material 18Bx are located inside the gaps G of the inorganic insulating layer 11B. At this time, the uncured first resin material 16Bx and the uncured second resin material 13Bx are fluidized and efficiently enter the gaps G of the inorganic insulating layer 11A. Thereafter, the heating is performed at a temperature of the curing starting temperature of the uncured first resin material 16Bx and the uncured second resin material 18Bx or higher and lower than the thermal decomposition temperature thereof.

Respective conditions on the heating and the pressing the first resin precursor 12Bx, the inorganic insulating layer 11B, and the second resin precursor 13Bx are similar to those of the heating and pressing in, for example, the step (6). Further, formation of the first resin layer 12B and the second resin layer 13B may not be performed at the same time.

(9) As illustrated in FIG. 12(a), the via conductor 21 penetrating the first resin layer 12B, the inorganic insulating layer 11B, and the second resin layer 13B in the thickness direction is formed and the conductive layer 8B is formed on the second resin layer 13B. Specifically, this step will be performed as described below.

First, via holes V are formed in the first resin layer 12B, the inorganic insulating layer 11B, and the second resin layer 13B using, for example, a YAG laser apparatus or a carbon dioxide laser apparatus and at least a part of the conductive layer 8 (here, the conductive layer 8A) is exposed to the bottom of the via holes V. Next, the via conductor 21 is formed in the via hole V and the conductive layer 8B is formed on the second resin layer 13B using, for example, a semi-additive method or a subtractive method.

(10) As illustrated in FIG. 12(b), a pair of wiring layers 6 are formed on both main surfaces of the core board 5 by repeating the steps of (8) and (9). Further, the wiring layer 6 can be made to be multilayered by repeating the steps.

As described above, the wiring board 6 can be prepared.

(11) The mounting structure 1 illustrated in FIG. 1 can be prepared by flip-chip mounting the electronic component 2 on the wiring board 3 with the bump 4 on the surface in which the second resin layer 13B is exposed in one surface of the above-described wiring board 3.

As described above, in the manufacturing method of the present embodiment, the first resin material 16 and the second resin material 18 are allowed to enter the gaps G from both surfaces of the inorganic insulating layer 11. As a result, occurrence of voids in which the resin material is not disposed can be reduced because the resin material can be allowed to efficiently enter the gaps G when compared to a case where the resin material is allowed to enter the gaps G only from one main surface of the inorganic insulating layer 11.

In addition, even when the thickness of the inorganic insulating layer 11 is increased, the resin material can be effectively permeated into the inside of the inorganic insulating layer 11. As a result, the Young's modulus of the wiring board 3 can be increased by thickening the inorganic insulating layer 11. Therefore, since warpage or deformation of the wiring board 3 can be reduced, the yield obtained when the electronic component 2 is mounted on the wiring board 3 can be improved.

In addition, it is preferable that the first resin precursor 12x and the second resin precursor 13x include a plurality of the dispersed filler particles 19 whose diameter is larger than the width of the gaps G. As a result, by the uncured first resin material 16x and the second resin material 18x of the first resin precursor 12Bx and the second resin precursor 13x being located inside the inorganic insulating layer 11, the plurality of filler particles 19 are aggregated such that the plurality of filler particles 19 are filtered on the outer layer of the inorganic insulating layer 11, and the first resin layer 12B and the second resin layer 13 in which the content ratio of the filler particles 19 in an area closer to the inorganic insulating layer 11 is greater than the content ratio of the filler particles 19 in an area farther from the inorganic insulating layer 11 can be formed. Therefore, members in which thermal expansion coefficients are different from each other between both end portions of the first resin layer 12B and between both end portions of the second resin layer 13 can be easily prepared and the yield thereof can be improved.

The content ratio of the filler particles 19 in the first resin precursor 12x is, for example, 10% by volume or more and 55% by volume or less. The content ratio of the filler particles 19 in the second resin precursor 13x is similar to that of the first resin precursor 12x. In addition, after the formation of the first resin layer 12, the content ratio of the filler particles 19 in the first resin layer 12 is, for example, 10% by volume or more and 70% by volume or less. The content ratio of the filler particles 19 in the second resin layer 13 is similar to that of the first resin layer 12.

It is preferable that the uncured first resin material 16x and the uncured second resin material 18x be made of only monomers and oligomers at a pre-stage that is before the uncured first resin material 16x and the uncured second resin material 18x entering the gaps G of the inorganic insulating layer 11. As a result, monomers and oligomers can efficiently enter the gaps G because the amount of molecules is smaller than that of a polymer.

Further, it is preferable that the ratio of the monomers of the uncured first resin material 16x and the uncured second resin material 18x be greater than that of the oligomers at a pre-stage that is before the uncured first resin material 16x and the uncured second resin material 18x entering the gaps G of the inorganic insulating layer 11. As a result, monomers can efficiently enter the gaps G because the amount of molecules of monomers is smaller than that of oligomer.

Further, monomer in the resin material is a monomeric unit. Oligomer is a polymer with a relatively low molecular weight, in which 10 or more and 300 or less monomers are bound to each other. Polymer includes more than 300 monomers bound to each other.

Further, by allowing the first resin material 16 and the second resin material 18 to enter the gaps G from both main surfaces of the inorganic insulating layer 11, it is possible to suppress an excessive amount of the resin material entering from one of the resin layers. As a result, for example, in the step (5), in a case where the thickness of the inorganic insulating layer 11A formed on both main surfaces of the first resin layer 12A is greater than that of the first resin layer 12A, it is possible to suppress an excessive amount of the first resin material 16A entering the gaps G of the inorganic insulating layer 11A, and bubbles to be generated in the base material 17 on which the first resin material 16A is covered can be reduced.

Further, in the step (2), the inorganic insulating sol 11x applied to one main surface of the support sheet 22 may be left as it is for a certain period of time, the second inorganic insulating particles 15 having the average particle diameter and the mass greater larger than those of the first inorganic insulating particles 14 may be settled on the support sheet side in the inorganic insulating sol 11x, and a larger amount of the second inorganic insulating particles 15 may be aggregated on the support sheet side.

As a result, for example, in the step of (5), the width of the gaps G of the inorganic insulating layer 11 on the first resin layer 12A side can be reduced, it is possible to suppress an excessive amount of the first resin material 16A entering the gaps G, and bubbles to be generated in the first resin layer 12A can be efficiently reduced.

The present invention is not limited to the above-described embodiments and various modifications, alteration, and combinations are possible within the range not departing the scope of the present invention.

For example, the above-described embodiments of the present invention are described using the configuration in which the wiring board with the wiring layer formed on both main surfaces of the core board is used, but a wiring board with only a core board or a wiring board with only a wiring layer (coreless board) may be used.

Further, in the above-described embodiments of the present invention, description on a solder resist layer is omitted, but the wiring board may include a solder resist layer including a resin material on upper and lower surfaces.

Further, in the above-described embodiments of the present invention, description on an underfill is omitted, but the mounting structure may include an underfill between the wiring board and the electronic component.

Further, the above-described embodiments of the present invention are described using the configuration in which the core board and the wiring layer include the inorganic insulating layer as an example, but only the core board or only the wiring layer may include the inorganic insulating layer.

Further, the above-described embodiments of the present invention are described using the configuration in which the first resin layer includes the base material as an example, but the first resin layer may not include the base material.

Furthermore, the above-described embodiments of the present invention are described using the configuration in which the first resin layer and the second resin layer include the filler particles as an example, but the first resin layer and the second resin layer may not include the filler particles.

REFERENCE SIGNS LIST

1 MOUNTING STRUCTURE
2 ELECTRONIC COMPONENT
3 WIRING BOARD
4 BUMP
5 CORE BOARD
6 WIRING LAYER
7 BASE
8, 8A, 8B CONDUCTIVE LAYER
9 THROUGH-HOLE CONDUCTOR
10 INSULATOR
11, 11A, 11B INORGANIC INSULATING LAYER
11x INORGANIC INSULATING SOL
12, 12A, 12B FIRST RESIN LAYER
12x, 12Ax, 12Bx FIRST RESIN PRECURSOR
13, 13A, 13B SECOND RESIN LAYER
13x, 13Ax, 13Bx SECOND RESIN PRECURSOR
14 FIRST INORGANIC INSULATING PARTICLES
15 SECOND INORGANIC INSULATING PARTICLES
16, 16A, 16B FIRST RESIN PORTION
16x, 16Ax, 16Bx UNCURED FIRST RESIN MATERIAL
17 BASE MATERIAL
18, 18A, 18B SECOND RESIN PORTION
18x, 18Ax, 18Bx UNCURED SECOND RESIN MATERIAL
19 FILLER PARTICLES
20 THIRD RESIN LAYER
21 VIA CONDUCTOR
22 SUPPORT SHEET
23 LAMINATED SHEET
B CONTACT SURFACE
G GAP
N NECK
T THROUGH-HOLE
V VIA HOLE

The invention claimed is:

1. A wiring board, comprising:
an inorganic insulating layer;
a first resin layer on one main surface of the inorganic insulating layer;
a second resin layer on another main surface of the inorganic insulating layer;
a conductive layer partially on one main surface of the second resin layer, the one main surface being on an opposite side to the inorganic insulating layer; and
a third resin layer formed by covering the conductive layer on the one main surface of the second resin layer,
wherein
the inorganic insulating layer comprises a plurality of first inorganic insulating particles which are bound to each other at a part of each of the first inorganic insulating particles, and gaps which are surrounded by the plurality of first inorganic insulating particles,
a part of the first resin layer and a part of the second resin layer are located inside the gaps,
the third resin layer is made of a resin material which is the same as that of the second resin layer,
the third resin layer comprises the plurality of filler particles,
the plurality of filler particles are dispersed in the third resin layer, and
a content ratio of the plurality of filler particles in an area of a side of the conductive layer is smaller than that of the plurality of filler particles in an area of an opposite side to the conductive layer in the third resin layer.

2. A method of manufacturing a wiring board, comprising:
preparing an inorganic insulating layer that comprises a plurality of first inorganic insulating particles which are bound to each other at a part of each of the first inorganic insulating particles and gaps which are surrounded by the plurality of first inorganic insulating particles;
disposing a first resin precursor formed of an uncured first resin material in a form of a layer on one main surface of the inorganic insulating layer;
disposing a second resin precursor formed of an uncured second resin material in a form of a layer on another main surface of the inorganic insulating layer;
heating and pressing the inorganic insulating layer on which the first resin precursor is disposed at a temperature of less than a curing starting temperature of the first resin material and allowing a part of the first resin precursor to be located inside a part of the gaps of the inorganic insulating layer;
heating the inorganic insulating layer and the first resin precursor at a temperature higher than or equal to the curing starting temperature of the first resin material and making the first resin precursor into a first resin layer;

heating and pressing the inorganic insulating layer on which the second resin precursor is disposed at a temperature of less than the curing starting temperature of the second resin material and allowing a part of the second resin precursor to be located inside a part of the gaps of the inorganic insulating layer;

heating the inorganic insulating layer and the second resin precursor at a temperature higher than or equal to the curing starting temperature of the second resin material and making the second resin precursor into a second resin layer; and forming a conductive layer on one main surface of the second resin layer, the one main surface being on an opposite side to the inorganic insulating layer.

3. The method of manufacturing the wiring board according to claim 2, wherein the step of making the first resin precursor into the first resin layer is performed before the step of allowing a part of the second resin material to be located inside a part of the gaps of the inorganic insulating layer.

4. The method of manufacturing the wiring board according to claim 3, wherein in the step of disposing the second resin precursor in a form of a layer, the second resin precursor, to which a plurality of filler particles whose average particle diameter is greater than a width of each of the gaps and which are made of an inorganic insulating material are dispersed, is disposed on another main surface of the inorganic insulating layer in a form of a layer.

5. A mounting structure, comprising:

the wiring board according to claim 1; and an electronic component mounted on one main surface of a side of the second resin layer of the wiring board.

* * * * *